United States Patent
Kim et al.

(10) Patent No.: US 8,669,551 B2
(45) Date of Patent: Mar. 11, 2014

(54) TRANSISTOR INCLUDING INSERTION LAYER AND CHANNEL LAYER WITH DIFFERENT WORK FUNCTIONS AND METHOD OF MANUFACTURING THE SAME

(75) Inventors: Sun-il Kim, Daejeon (KR); Young-soo Park, Seoul (KR); I-hun Song, Seongnam-si (KR); Chang-jung Kim, Yongin-si (KR); Jae-chul Park, Seoul (KR); Sang-wook Kim, Suwon-si (KR)

(73) Assignee: Samsung Electronics Co., Ltd., Gyeonggi-Do ( * ) Notice: Subject to any disclaimer, the term of this patent is extended or adjusted under 35 U.S.C. 154(b) by 323 days.

(21) Appl. No.: 12/289,252

(22) Filed: Oct. 23, 2008

(65) Prior Publication Data

US 2009/0224238 A1 Sep. 10, 2009

(30) Foreign Application Priority Data

Mar. 7, 2008 (KR) ........................ 10-2008-0021567

(51) Int. Cl.
*H01L 29/10* (2006.01)
*H01L 29/12* (2006.01)

(52) U.S. Cl.
USPC ............................................ 257/43; 257/347

(58) Field of Classification Search
USPC .................................................. 257/43, 347
See application file for complete search history.

(56) References Cited

U.S. PATENT DOCUMENTS

| | | | |
|---|---|---|---|
| 5,986,291 A | | 11/1999 | Currie et al. |
| 6,838,308 B2 * | | 1/2005 | Haga .............................. 438/104 |
| 7,145,174 B2 * | | 12/2006 | Chiang et al. ................... 257/59 |
| 7,564,055 B2 | | 7/2009 | Hoffman |
| 2002/0014440 A1 * | | 2/2002 | Oder et al. .......... 209/8 |
| 2004/0127038 A1 * | | 7/2004 | Carcia et al. .................. 438/689 |
| 2004/0155270 A1 * | | 8/2004 | Hoffman ........................ 257/288 |
| 2005/0017302 A1 * | | 1/2005 | Hoffman ........................ 257/347 |
| 2005/0199959 A1 * | | 9/2005 | Chiang et al. ................. 257/368 |
| 2006/0088962 A1 | | 4/2006 | Herman et al. |
| 2006/0172480 A1 | | 8/2006 | Wang et al. |

FOREIGN PATENT DOCUMENTS

| | | |
|---|---|---|
| JP | 2002-076347 | 3/2002 |
| JP | 2003-069030 | 3/2003 |
| JP | 2007-073701 | 3/2007 |
| JP | 2007-519256 | 7/2007 |
| KR | 10-2006-0132659 | 12/2006 |

OTHER PUBLICATIONS

Kikuchi et al. "Measurement on Work Function of Polycrystalline Zinc oxide Covered by Organic Dye" Applied Optics; vol. 8, Issue 51, p. 42-44.*

Chinese Office Action dated Jun. 14, 2012 issued in corresponding Chinese Application No. 200810179474.1.

(Continued)

*Primary Examiner* — Thao Le
*Assistant Examiner* — Geoffrey Ida
(74) *Attorney, Agent, or Firm* — Harness, Dickey & Pierce, P.L.C.

(57) ABSTRACT

A transistor according to example embodiments may include a channel layer, a source and a drain respectively contacting ends of the channel layer, a gate electrode separated from the channel layer, a gate insulating layer interposed between the channel layer and the gate electrode, and/or an insertion layer that is formed between the channel layer and the gate insulating layer. The insertion layer may have a work function different from that of the channel layer.

20 Claims, 6 Drawing Sheets

(56) References Cited

OTHER PUBLICATIONS

Chinese Office Action dated Feb. 25, 2013 issued in corresponding Chinese Application No. 200810179474.1.

Japanese Office Action dated Jul. 16, 2013 issued in corresponding Japanese Application No. 2008-313263 and English translation thereof.

* cited by examiner

US 8,669,551 B2

TRANSISTOR INCLUDING INSERTION LAYER AND CHANNEL LAYER WITH DIFFERENT WORK FUNCTIONS AND METHOD OF MANUFACTURING THE SAME

PRIORITY STATEMENT

This application claims the benefit under 35 U.S.C. §119 to Korean Patent Application No. 10-2008-0021567, filed on Mar. 7, 2008 with the Korean Intellectual Property Office (KIPO), the entire contents of which are incorporated herein by reference.

BACKGROUND

1. Technical Field

Example embodiments relate to a semiconductor device and a method of manufacturing the same.

2. Description of the Related Art

Transistors are commonly used as switching devices or driving devices in electronic devices. A thin film transistor can be formed on a glass substrate or a plastic substrate. As a result, thin film transistors are often used in flat panel display apparatuses (e.g., liquid crystal display apparatuses, organic light-emitting display apparatuses).

To increase the operational characteristic of a transistor, attempts have been made to utilize an oxide layer (e.g., ZnO-based layer having a high carrier mobility) as a channel layer of the transistor. This conventional method is mainly employed for manufacturing thin film transistors for flat panel display apparatuses. However, the threshold voltage is difficult to control in a transistor having an oxide layer as the channel layer (e.g., conventional oxide transistor).

A conventional oxide transistor mainly uses an n-type oxide layer as the channel layer. To obtain a high ON/OFF current ratio and a small subthreshold slope (S.S.), the n-type oxide layer must have a high carrier concentration and a high crystallinity. To control the threshold voltage, if the carrier concentration of the n-type oxide layer is reduced, the ON/OFF current ratio is reduced and the subthreshold slope (S.S.) is increased, thus degrading the operational characteristics of the transistor.

SUMMARY

A transistor according to example embodiments may include a channel layer; a source and a drain respectively contacting opposing ends of the channel layer; a gate electrode isolated from the channel layer; a gate insulating layer between the channel layer and the gate electrode; and/or an insertion layer between the channel layer and the gate insulating layer. The transistor may be a thin film transistor. The channel layer may include an oxide. The oxide may be zinc oxide, copper oxide, or nickel oxide. The insertion layer may have a work function different from that of the channel layer. Thus, the insertion layer may facilitate in controlling the threshold voltage.

The channel layer may be an n-type semiconductor layer. For example, the channel layer may be a zinc oxide layer doped with at least one of a group 13 element and a group 14 element. The insertion layer may be a p-type or an n-type semiconductor layer when the channel layer is an n-type semiconductor layer. Additionally, the insertion layer may have a work function greater than that of the channel layer when the channel layer is an n-type semiconductor layer. In such case, the insertion layer may also have an energy band gap greater than that of the channel layer.

The channel layer may be a p-type semiconductor layer. For example, the channel layer may be a zinc oxide layer doped with at least one of a group 1 element, a group 2 element, a group 15 element, and a transition metal. The insertion layer may be an n-type or a p-type semiconductor layer when the channel layer is a p-type semiconductor layer. Additionally, the insertion layer may have a work function smaller than that of the channel layer when the channel layer is a p-type semiconductor layer. In such a case, the insertion layer may also have an energy band gap smaller than that of the channel layer.

A method of manufacturing a transistor according to example embodiments may include forming a channel layer and a gate electrode on a substrate, the channel layer being isolated from the gate electrode; forming a source and a drain on the substrate, the source and the drain respectively contacting opposing ends of the channel layer; forming a gate insulating layer between the channel layer and the gate electrode; and/or forming an insertion layer between the channel layer and the gate insulating layer, the insertion layer having a work function different from that of the channel layer. The gate electrode may be formed above the channel layer. Alternatively, the gate electrode may be formed below the channel layer.

BRIEF DESCRIPTION OF THE DRAWINGS

The features of example embodiments may become more apparent upon review of the detailed description with reference to the accompanying drawings. In the drawings, the thicknesses of the layers and/or regions may have been exaggerated for clarity.

DETAILED DESCRIPTION OF EXAMPLE EMBODIMENTS

Figure 1:
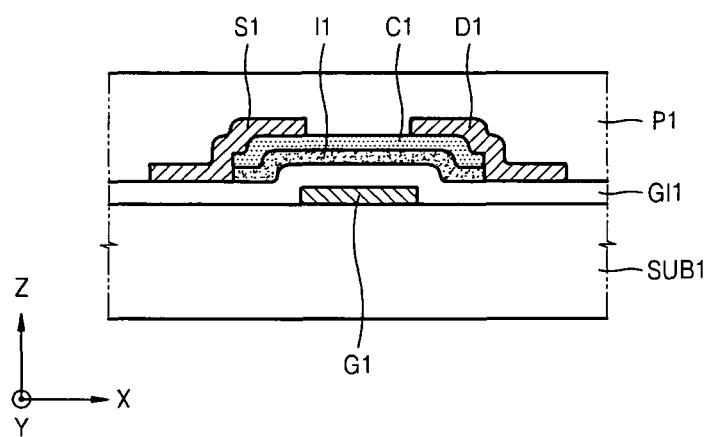
FIG. 1 is a cross-sectional view of a transistor according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a transistor according to example embodiments. The transistor may be a thin film transistor (hereinafter, a first thin film transistor). Referring to FIG. 1, the first thin film transistor may have a bottom gate structure, wherein a gate electrode G1 is formed below a channel layer C1. The gate electrode G1 may be formed on a substrate SUB1. The substrate SUB1 may be a silicon substrate, a glass substrate, or a plastic substrate. The substrate SUB1 may or may not be transparent. A gate insulating layer GI1 may be formed on the substrate SUB1 so as to cover the gate electrode G1. The gate insulating layer GI1 may be a silicon oxide layer, a silicon nitride layer, or another suitable material layer. An insertion layer I1 and the channel layer C1 may be sequentially formed on the gate insulating layer GI1 above the gate electrode G1. The insertion layer I1 and the channel layer C1 may have the same shape when viewed from above. The insertion layer I1 and the channel layer C1 may have a width in an X axis direction that is greater than that of the gate electrode G1 in the X axis direction.

The channel layer C1 may be an n-type or p-type semiconductor layer. The channel layer C1 may include an oxide (e.g., transition metal oxide). If the channel layer C1 is an n-type semiconductor layer, the channel layer C1 may be an oxide layer doped with at least one of a group 13 element or a group 14 element. For example, the channel layer C1 may be a zinc oxide (ZnO) layer doped with at least one of indium (In), gallium (Ga), and tin (Sn). If the channel layer C1 is a p-type semiconductor layer, the channel layer C1 may be an oxide layer doped with at least one of a group 1 element, a group 2 element, a group 15 element, and a transition metal. For example, the channel layer C1 may be a copper (Cu) oxide layer, a nickel (Ni) oxide layer, or a ZnO layer. The Ni oxide layer may be doped with a group 4 transition metal (e.g., Ti). The ZnO layer may be doped with at least one of a group 1 element, a group 2 element, a group 15 element, and a transition metal (e.g., Ag).

The insertion layer I1 may have a work function different from that of the channel layer C1. The insertion layer I1 may be an n-type semiconductor layer or a p-type semiconductor layer. For example, the insertion layer I1 and the channel layer C1 may both be n-type semiconductor layers or p-type semiconductor layers. Alternatively, when the channel layer C1 is a n-type semiconductor layer, then the insertion layer I1 may be a p-type semiconductor layer. Conversely, when the channel layer C1 is a p-type semiconductor layer, then the insertion layer I1 may be a n-type semiconductor layer.

If the channel layer C1 is an n-type semiconductor layer, then the insertion layer I1 may have a work function greater than that of the channel layer C1. For example, the work function of the insertion layer I1 may be greater than the work function of the channel layer C1 by about 0.1-4 eV. If the insertion layer I1 has a work function greater than that of the channel layer C1, then the insertion layer I1 may also have an energy band gap greater than that of the channel layer C1.

On the other hand, if the channel layer C1 is a p-type semiconductor layer, then the insertion layer I1 may have a work function smaller than that of the channel layer C1. For example, the work function of the insertion layer I1 may be smaller than the work function of the channel layer C1 by about 0.1-4 eV. If the insertion layer I1 has a work function smaller than that of the channel layer C1, then the insertion layer I1 may also have an energy band gap smaller than that of the channel layer C1.

For example, if the insertion layer I1 is an n-type semiconductor layer, then the insertion layer I1 may be a Ga oxide layer. If the insertion layer I1 is a p-type semiconductor layer, then the insertion layer I1 may be a Cu oxide layer, an Ni oxide layer, or a ZnO layer. The Ni oxide layer may be doped with a group 4 transition metal (e.g., Ti). The ZnO layer may be doped with at least one of a group 1 element, a group 2 element, a group 15 element, and a transition metal (e.g., Ag). A non-oxide layer may also be used as the insertion layer I1. The insertion layer I1 may have a work function different from that of the channel layer C1. As a result, the insertion layer I1 may perform the function of controlling the threshold voltage of the channel layer C1. The function of the insertion layer I1 will be subsequently described in further detail.

A source electrode S1 and a drain electrode D1 may be formed on the gate insulating layer GI1 so as to respectively contact opposing sides of the channel layer C1. Each of the source electrode S1 and the drain electrode D1 may be a single metal layer or a multiple metal layer. The source electrode S1 and the drain electrode D1 may be formed of the same metal used to form the gate electrode G1. Alternatively, the source electrode S1 and the drain electrode D1 may be formed of a different material from that used to form the gate electrode G1. A passivation layer P1 may be formed on the gate insulating layer GI1 so as to cover the channel layer C1, the source electrode S1, and the drain electrode D1. The passivation layer P1 may be a silicon oxide layer or a silicon nitride layer.

The gate electrode G1 may have a thickness of about 50 to 300 nm. The gate insulating layer GI1 may have a thickness of about 50 to 300 nm. The insertion layer I1 may have a thickness of about 1 to 100 nm. The channel layer C1 may have a thickness of about 30 to 200 nm. The source electrode S1 may have a thickness of about 10 to 200 nm. The drain electrode D1 may have a thickness of about 10 to 200 nm.

Figure 2:
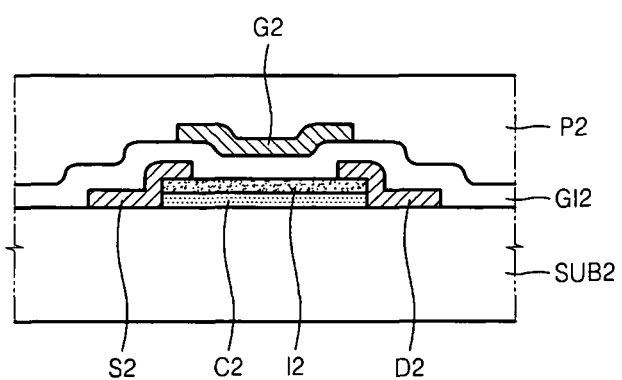
FIG. 2 is a cross-sectional view of another transistor according to example embodiments.

FIG. 2 is a cross-sectional view of another transistor according to example embodiments. The transistor may be a thin film transistor (hereinafter, a second thin film transistor). Referring to FIG. 2, the second thin film transistor may have a top gate structure wherein a gate electrode G2 is formed above a channel layer C2. The channel layer C2 and the insertion layer I2 may be sequentially formed on a substrate SUB2. A source electrode S2 and a drain electrode D2 may be formed on the substrate SUB2 so as to respectively contact the opposing ends of the channel layer C2. A gate insulating layer GI2 may be formed on the substrate SUB2 so as to cover the insertion layer I2, the source electrode S2, and the drain electrode D2. A gate electrode G2 may be formed on the gate insulating layer GI2. The gate electrode G2 may be positioned above the channel layer C2. A passivation layer P2 may be formed on the gate insulating layer GI2 so as to cover the gate electrode G2.

The materials for forming the substrate SUB2, the channel layer C2, the insertion layer I2, the source electrode S2, the drain electrode D2, the gate insulating layer GI2, the gate electrode G2, and the passivation layer P2 of FIG. 2 may be the same as those of the substrate SUB1, the channel layer C1, the insertion layer I1, the source electrode S1, the drain electrode D1, gate insulating layer GI1, the gate electrode G1, and the passivation layer P1 of FIG. 1. Similarly, the thicknesses of the various elements of FIG. 2 may be the same as those of FIG. 1.

A method of controlling a threshold voltage of a channel layer via an insertion layer in a transistor according to example embodiments will be described in further detail with reference to FIGS. 3 through 6. FIGS. 3 through 6 are energy band diagrams of a channel layer and an insertion layer in transistors according to example embodiments. The channel layers of FIGS. 3 through 6 may correspond to the channel layers C1 and C2 of FIGS. 1 and 2, respectively. Similarly, the insertion layers of FIGS. 3 through 6 may correspond to the insertion layers I1 and I2 of FIGS. 1 and 2, respectively.

Figure 3:
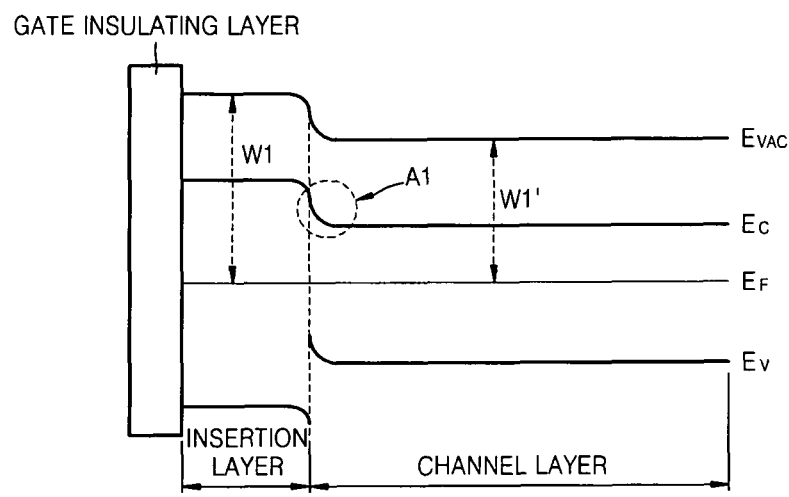
FIGS. 3 through 6 are energy band diagrams of a channel layer and an insertion layer in transistors according to example embodiments.
Figure 4:
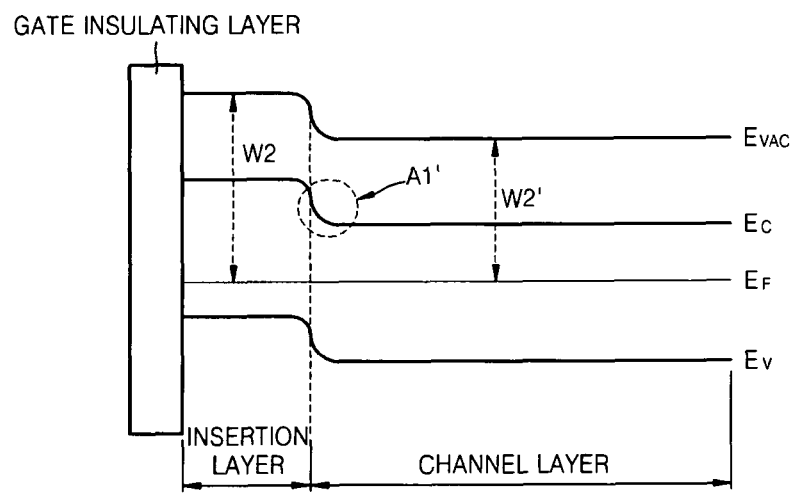
Figure 5:
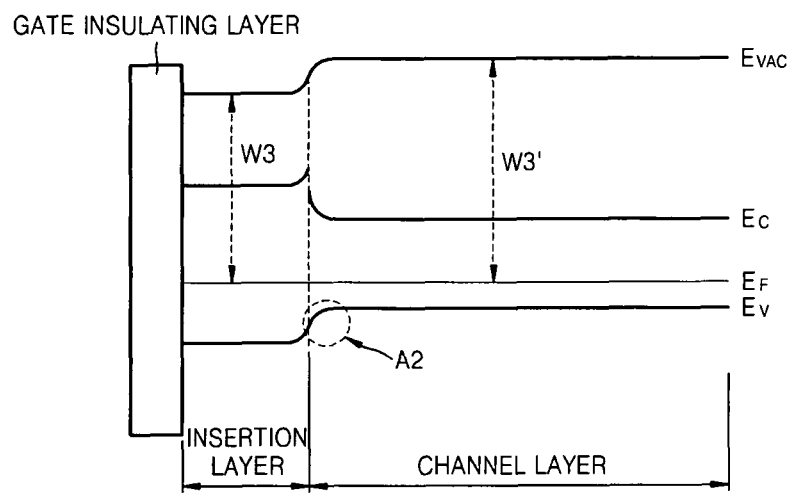
Figure 6:
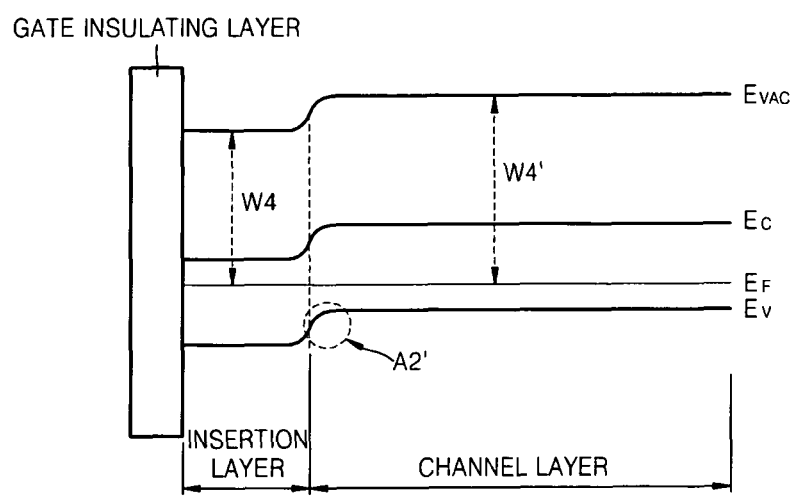

Referring to FIG. 3, both the channel layer and the insertion layer are n-type semiconductor layers. Referring to FIG. 4, the channel layer and the insertion layer may be an n-type semiconductor layer and a p-type semiconductor layer, respectively. Referring to FIG. 5, both the channel layer and the insertion layer are p-type semiconductor layers. Referring to FIG. 6, the channel layer and the insertion layer are a p-type semiconductor layer and an n-type semiconductor layer, respectively. In FIGS. 3 through 6, reference characters $E_{VAC}$, $E_C$, $E_F$, and $E_V$ respectively refer to a vacuum energy level, the lowermost energy level of a conduction band, a Fermi energy level, and the uppermost energy level of a valence band. Also, reference characters W1 through W4 refer to the work functions of the insertion layers, while reference characters W1' through W4' refer to the work functions of the channel layers.

Referring to FIGS. 3 and 4, because the insertion layers have work functions W1 and W2 greater than the work functions W1' and W2' of the channel layers, depletion regions are generated on surfaces of the channel layers that contact the insertion layers. As depicted in first regions A1 and A1', the lowermost energy level of the conduction band $E_C$ of the channel layers bends upwards. Thus, the threshold voltage of the channel layer moves to the (+) side compared to the case in which the insertion layer is not included. The degree of moving towards the (+) side may vary according to the difference between the work functions W1 and W2 of the insertion layers and the work functions W1' and W2' of the channel layers. The work functions W1 and W2 of the insertion layers may be readily controlled by controlling the carrier concentration of the insertion layers when forming the insertion layers.

Referring to FIGS. 5 and 6, because the work functions W3 and W4 of the insertion layers are smaller than the work functions W3' and W4' of the channel layers, the uppermost energy level of a valence band $E_V$ of the channel layers bends downwards in the region adjoining the channel layers and the insertion layers, as depicted in second regions A2 and A2'. Thus, the threshold voltage of the channel layers moves to the (−) side compared to the case in which the insertion layer is not included. The degree of moving towards the (−) side may vary according to the difference between the work functions W3 and W4 of the insertion layers and the work functions W3' and W4' of the channel layers.

According to example embodiments, the threshold voltage of a channel layer may be controlled via an insertion layer without the need for changing the carrier concentration of the channel layer. Thus, in a state in which an operational characteristic of a transistor is secured by maintaining a relatively high carrier mobility of the channel layer, it is possible to control the threshold voltage of a channel layer.

FIGS. 7A through 7D are cross-sectional views of a method of manufacturing a transistor according to example embodiments. The transistor according to example embodiments may be a thin film transistor having a bottom gate structure. The transistor manufactured according to FIGS. 7A through 7D may correspond to the transistor of FIG. 1. Like reference numerals are used to indicate like elements.

Figure 7A:
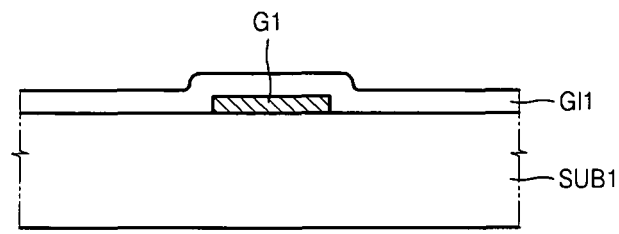
FIGS. 7A through 7D are cross-sectional views of a method of manufacturing a transistor according to example embodiments.

Referring to FIG. 7A, a gate electrode G1 may be formed on a substrate SUB1. A gate insulating layer GI1 may be formed on the substrate SUB1 so as to cover the gate electrode G1. The gate insulating layer GI1 may be formed of a silicon oxide, a silicon nitride, or other suitable materials.

Figure 7B:
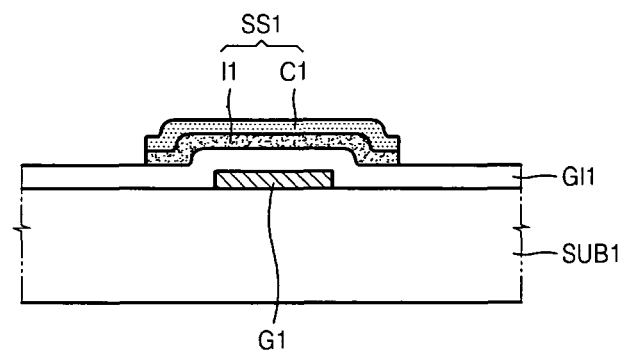

Referring to FIG. 7B, a first stack structure SS1 may be formed on the gate insulating layer GI1. The first stack structure SS1 may include an insertion layer I1 and a channel layer C1. The first stack structure SS1 may be positioned above the gate electrode G1, and the insertion layer I1 may be interposed between the gate insulating layer GI1 and the channel layer C1. The insertion layer I1 and the channel layer C1 may be deposited using a physical vapor deposition (PVD) method (e.g., sputtering method, evaporation method). Additionally, the insertion layer I1 and the channel layer C1 may be patterned using the same mask layer.

Figure 7C:
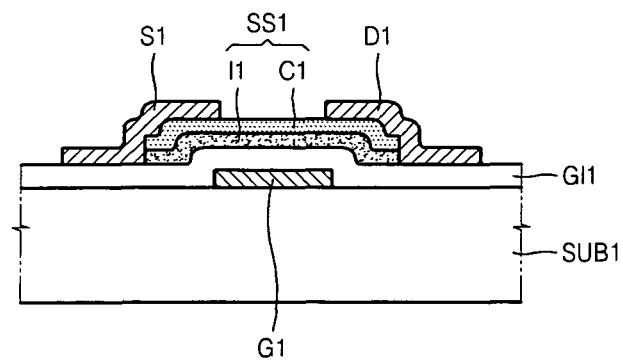

Referring to FIG. 7C, a source electrode S1 and a drain electrode D1 may be formed on the gate insulating layer GI1 so as to respectively contact the opposing ends of the channel layer C1 while leaving a portion of an upper surface of the channel layer C1 exposed. The source electrode S1 and the drain electrode D1 may each be formed as a single metal layer or a multiple metal layer.

Figure 7D:
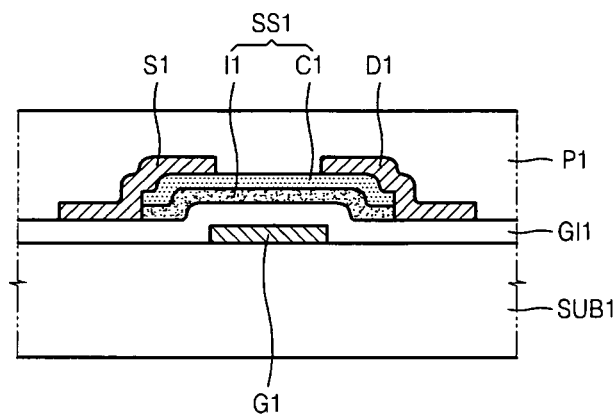

Referring to FIG. 7D, a passivation layer P1 may be formed on the gate insulating layer GI1 so as to cover the exposed portion of the channel layer C1, the source electrode S1, and the drain electrode D1. The resulting structure may be annealed at a predetermined temperature to achieve a transistor according to example embodiments.

FIGS. 8A through 8D are cross-sectional views of another method of manufacturing a transistor according to example embodiments. The transistor according to example embodiments may be a thin film transistor having a top gate structure. The transistor manufactured according to FIGS. 8A through 8D may correspond to the transistor of FIG. 2. Like reference numerals are used to indicate like elements.

Figure 8A:
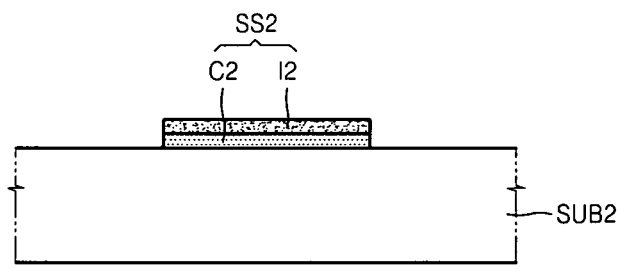
FIGS. 8A through 8D are cross-sectional views of another method of manufacturing a transistor according to example embodiments.

Referring to FIG. 8A, a second stack structure SS2 may be formed on a substrate SUB2. The second stack structure SS2 may include a channel layer C2 and insertion layer I2. The insertion layer I2 may be formed on the channel layer C2. The method of forming the second stack structure SS2 may be similar to the method of forming the first stack structure SS1 of FIG. 7B.

Figure 8B:
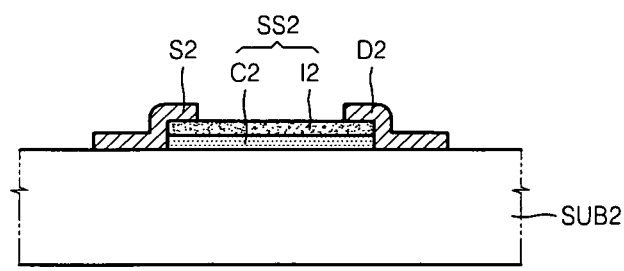

Referring to FIG. 8B, a source electrode S2 and a drain electrode D2 may be formed on the substrate SUB2 so as to respectively contact the opposing ends of the second stack structure SS2 while leaving a portion of an upper surface of the insertion layer I2 exposed. The source electrode S2 and the drain electrode D2 may each be formed as a single metal layer or a multiple metal layer.

Figure 8C:
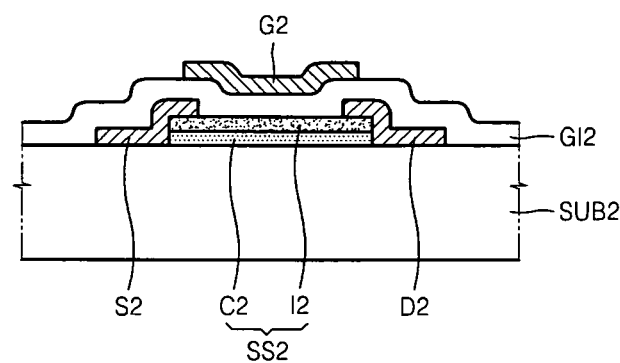

Referring to FIG. 8C, a gate insulating layer GI2 may be formed on the substrate SUB2 so as to cover the exposed portion of the insertion layer I2, the source electrode S2, and the drain electrode D2. A gate electrode G2 may be formed on the gate insulating layer GI2. The gate electrode G2 may be formed above the channel layer C2 and the insertion layer I2. The gate electrode G2 may be formed of the same metal used to form the source electrode S2 and the drain electrode D2. Alternatively, the gate electrode G2 may be formed of a different material.

Figure 8D:
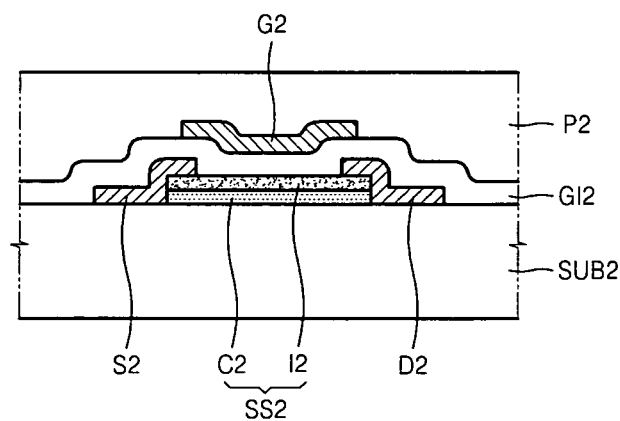

Referring to FIG. 8D, a passivation layer P2 may be formed on the gate insulating layer GI2 so as to cover the gate electrode G2. The passivation layer P2 may be formed of a silicon oxide or a silicon nitride. The resulting structure may be annealed at a predetermined temperature to achieve a transistor according to example embodiments.

While example embodiments have been shown and described with reference to the accompanying drawings, the scope of the present application should not be construed as being limited to example embodiments. For instance, one of ordinary skill in the art would understand that the teachings herein may be applied to other transistors besides thin film transistors. Also, the constituent elements and structures of the transistors of FIGS. 1 and 2 may be modified in various forms, and the transistors according to example embodiments may be used not only for liquid crystal display apparatuses and organic light-emitting display apparatuses but also for memory devices and logic devices. Therefore, the scope of the present application should not be interpreted as being unduly limited to the literal text of the detailed description.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

The invention claimed is:

1. A transistor comprising:
   a channel layer;
   a source and a drain respectively contacting opposing ends of the channel layer;
   a gate electrode isolated from the channel layer;
   a gate insulating layer between the channel layer and the gate electrode; and
   an insertion layer between the channel layer and the gate insulating layer, the insertion layer having a work function different from that of the channel layer, the insertion layer being formed of a different base material from the channel layer, the insertion layer being a semiconductor layer, the insertion layer being formed of a single layer, and the insertion layer directly contacting the channel layer and the gate insulating layer,
   wherein the channel layer is an n-type semiconductor layer and the insertion layer is a p-type or an n-type semiconductor layer.

2. The transistor of claim 1, wherein the channel layer includes an oxide.

3. The transistor of claim 2, wherein the oxide is zinc oxide, copper oxide, or nickel oxide.

4. The transistor of claim 1, wherein the channel layer is a zinc oxide layer doped with at least one of a group 13 element and a group 14 element.

5. The transistor of claim 1, wherein the insertion layer has a work function greater than that of the channel layer.

6. The transistor of claim 5, wherein the insertion layer has an energy band gap greater than that of the channel layer.

7. A transistor comprising:
   a channel layer;
   a source and a drain respectively contacting opposing ends of the channel layer;
   a gate electrode isolated from the channel layer;
   a gate insulating layer between the channel layer and the gate electrode; and
   an insertion layer between the channel layer and the gate insulating layer, the insertion layer having a work function different from that of the channel layer, the insertion layer being formed of a different base material from the channel layer, the insertion layer being a semiconductor layer, the insertion layer being formed of a single layer, and the insertion layer directly contacting the channel layer and the gate insulating layer,
   wherein the channel layer is a p-type semiconductor layer and the insertion layer is an n-type or a p-type semiconductor layer.

8. The transistor of claim 7, wherein the channel layer is one of a copper oxide layer, a nickel oxide layer, and a zinc oxide layer, wherein the nickel oxide layer is optionally doped with a group 4 transition metal and the zinc oxide layer is doped with at least one of a group 1 element, a group 2 element, a group 15 element, and a transition metal.

9. The transistor of claim 7, wherein the insertion layer has a work function smaller than that of the channel layer.

10. The transistor of claim 9, wherein the insertion layer has an energy band gap smaller than that of the channel layer.

11. The transistor of claim 1, wherein the gate electrode is above the channel layer.

12. The transistor of claim 1, wherein the gate electrode is below the channel layer.

13. A method of manufacturing a transistor, comprising:
forming a channel layer and a gate electrode on a substrate, the channel layer isolated from the gate electrode;
forming a source and a drain on the substrate, the source and the drain respectively contacting opposing ends of the channel layer;
forming a gate insulating layer between the channel layer and the gate electrode; and
forming an insertion layer between the channel layer and the gate insulating layer, the insertion layer having a work function different from that of the channel layer, the insertion layer being formed of a different base material from the channel layer, the insertion layer being a semiconductor layer, the insertion layer being formed of a single layer, and the insertion layer directly contacting the channel layer and the gate insulating layer,
wherein the channel layer is an n-type or a p-type semiconductor layer and the insertion layer is a p-type or an n-type semiconductor layer.

14. The method of claim 13, wherein the insertion layer is formed to have a work function greater than that of the channel layer.

15. The method of claim 13, wherein the insertion layer is formed to have a work function smaller than that of the channel layer.

16. The method of claim 13, wherein the gate electrode is formed above the channel layer.

17. The method of claim 13, wherein the gate electrode is formed below the channel layer.

18. The transistor of claim 1, wherein the work function of the insertion layer differs from a work function of the channel layer by about 0.1-4 eV.

19. The method of claim 13, wherein the work function of the insertion layer differs from a work function of the channel layer by about 0.1-4 eV.

20. A transistor comprising:
a channel layer;
a source and a drain respectively contacting opposing ends of the channel layer;
a gate electrode isolated from the channel layer;
a gate insulating layer between the channel layer and the gate electrode; and
an insertion layer between the channel layer and the gate insulating layer, the insertion layer having a work function different from that of the channel layer, the insertion layer being formed of a different base material from the channel layer, and the insertion layer being a semiconductor layer,
wherein when the channel layer is an n-type semiconductor layer, the insertion layer has a work function greater than that of the channel layer and has an energy band gap greater than that of the channel layer, and when the channel layer is a p-type semiconductor layer, the insertion layer has a work function smaller than that of the channel layer and has an energy band gap smaller than that of the channel layer,
wherein the channel layer is an n-type or a p-type semiconductor layer and the insertion layer is a p-type or an n-type semiconductor layer.

* * * * *